United States Patent [19]

Jonker

[11] 4,239,805

[45] Dec. 16, 1980

[54] METHOD OF DEPOSITING A LAYER OF MAGNETIC BUBBLE DOMAIN MATERIAL ON A MONOCRYSTALLINE SUBSTRATE

[75] Inventor: Herman D. Jonker, Eindhoven, Netherlands

[73] Assignee: U.S. Philips Corporation, New York, N.Y.

[21] Appl. No.: 967,678

[22] Filed: Dec. 8, 1978

[30] Foreign Application Priority Data

Dec. 13, 1977 [NL] Netherlands ......................... 7713759

[51] Int. Cl.³ .......................... B32B 9/04; H01F 10/02
[52] U.S. Cl. .................................... 428/446; 427/128; 428/539; 428/900
[58] Field of Search .............................. 427/128–132, 427/48; 156/622, 624; 428/900, 446, 539

[56] References Cited

U.S. PATENT DOCUMENTS

| 3,486,937 | 12/1969 | Linares | 156/624 |
| 3,946,372 | 3/1976 | Henry et al. | 427/128 |

*Primary Examiner*—Bernard D. Pianalto
*Attorney, Agent, or Firm*—Marc D. Schechter

[57] ABSTRACT

In the LPE growth of magnetic bubble domain garnets from a melt the overall dependence of the saturation magnetization on the growth temperature can be adjusted to make the bubble domain collapse field independent of the growth temperature. In the melts, from which these garnets are grown, two types of non-magnetic ions are substituted for the iron ions, each of which ions, if substituted alone, would result in garnet materials having opposite dependence of the saturation magnetization on the growth temperature.

4 Claims, 8 Drawing Figures

METHOD OF DEPOSITING A LAYER OF MAGNETIC BUBBLE DOMAIN MATERIAL ON A MONOCRYSTALLINE SUBSTRATE

The invention relates to a method of depositing a layer of magnetic bubble domain material of rare earth-iron garnet on a monocrystalline substrate, in which a quantity of starting material is heated so as to form a uniform melt, after which the melt is brought to a supersaturated condition by cooling and the substrate is contacted with it until an epitaxial layer of the desired thickness has been deposited on the substrate.

Magnetic bubble domains of a generally cylindrical nature are formed in an isolated state in comparatively thin monocrystalline layers of certain uniaxially anisotropic materials, in particular rare earth-iron garnets, and they are manipulated for carrying out functions required in digital processors, for example, storage functions, logic functions and data transmission functions. Since the layer material is uniaxially anisotropic perpendicular to the plane of the thin layer, hard and easy axes of magnetization occur in the layer material. The bubble domains behave like isolated volumes in which the magnetic polarization of the ferromagnetic material is reversed with respect to the direction of the magnetic polarization of the remainder of the material, the magnetized regions being preferably polarized perpendicularly to the plane of the layer. The magnetic bubble domains are in certain conditions characterized by degrees of dimensional stability, while, if these conditions are not satisfied, the domains are either elongated or compressed in an uncontrollable manner, the smallest domains having a tendency to collapse and disappear. In a layer of optimum thickness, a bias magnetic field maintains the desired stable domains having a small diameter within a ferrimagnetic layer, characterized by a stable density of the domain wall energy.

Since in suitable circumstances the magnetic bubble domains have a stable position and size, they can easily perform a storage function. With stable domains of a small diameter, storage can be achieved with a large bit density. Other functions, such as the transmission of a data bit, for example, can be carried out by moving a domain from a first position to a second position, for example, by energizing a suitably placed magnetic loop, or by generating a magnetic rotating field. In this manner, for example, shift registers and other means for digital logic can be provided.

A bubble domain device is often constructed so that a number of separate bubble domain chips are united to form a module, which chips are stabilized by the same bias magnetic field.

Of the magnetic parameters which characterize a bubble domain layer, the most critical is the collapse field $H_o$. This is the field at which the bubble domains collapse and disappear. The operating margins of a bubble domain chip are directly related to $H_o$. It is therefore necessary that $H_o$ should be the same within narrow limits for all chips within one module of a bubble domain device. Up till now, however, the reproducibility of $H_o$ has been a great problem. For example, a current bubble domain material for 4 microns bubble domains is normally grown with a collapse field $H_o = 120 \pm 5$ Oe. This spread in $H_o$ is unacceptable and necessitates the control of $H_o$ to a standard value, which takes place by etching the grown layers to a greater or lesser extent (see J. Electronics Materials, 4,757 (1975)).

If this should not be done, it is a very cumbersome and expensive selection job to combine in a multi-chip module chips having overlapping work margins. In single-chip modules it is also sensible to use a standard value of $H_o$, because in this case the control of the bias field for each module individually becomes unnecessary.

The lack of reproducibility in the growth of bubble domain layers may be due to the fact that the collapse field $H_o$ depends on the growth temperature, and the growth temperature of a layer cannot be controlled sufficiently accurately. This also applies to the (strip) domain width in the demagnetized state which is a measure of the bubble domain diameter. Experiments therefore have been conducted in which the substrate has been rotated at different speeds during the epitaxial growth process so as to correct for differences in the temperature with time (see Mat. Res. Bul. 10, 807 (1975)). However, this method cannot be used in growing layers the composition of which is substantially independent of the speed of rotation. Moreover, this method imposes very high requirements upon the apparatus, for a deviation in the growth temperature of 0.5° C. can cause a variation of 2% of $H_o$.

SUMMARY OF THE INVENTION

It is an object of the invention to provide a method of depositing bubble domain layers on a substrate, which results in a product in which the sensitivity of the collapse field $H_o$ to variations in the growth temperature, with growth duration otherwise remaining the same, has been reduced to zero or substantially zero.

For that purpose, a method of the kind described above is characterized in that a starting material is provided which provides an epitaxial iron garnet layer represented by an atomic formula in which the iron ions are partly substituted by two types of non-magnetic ions; one type, if substituted alone, would give rise to a material with $$(d/dT_g)\, 4\pi M_s < 0,$$

the other type, if substituted alone, would give rise to a material with $$(d/dT_g)\, 4\pi M_s > 0,$$

the atomic ratio between the quantities of the two types of non-magnetic ions being chosen such that $1/H_o \, (d/dT_g)\, H_o$ is zero or substantially zero, wherein $4\pi M_s$ is the saturation magnetization of the material, the temperature at which the epitaxial layer is deposited on the substrate is substantially the temperature $T_g$, and $H_o$ is the bubble domain collapse field.

By making the collapse field $H_o$ independent of the growth temperature it is possible in principle to grow a whole series of bubble domain layers in succession with a very small spread in the collapse field $H_o$, which spread is much smaller than that of series of bubble domain layers which were grown in the conventional manner.

For practically useful bubble domain materials, the dependence of the collapse field on the growth temperature $T_g$ is expressed to a very good approximation by the following formula:

$$\frac{1}{H_o}\frac{dH_o}{dT_g} = \alpha\left(\frac{1}{4\pi M_s}\frac{d\, 4\pi M_s}{dT_g}\right) + \beta\left(\frac{1}{h}\frac{dh}{dT_g}\right) -$$

-continued

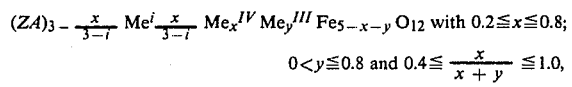

wherein h is the thickness of the layer, $K_u$ is the uniaxial anisotropy, and $\alpha$ and $\beta$ are positive parameters which depend on the ratio of the "material length" l to the layer thickness h. Since the other quantities are substantially fixed, it should be possible to manipulate $d4\pi M_s/dT_g$ so as to minimize $1/H_o\, dH_o/dT_g$.

The invention resides in the fact that in the bubble domain garnet layer two types of non-magnetic ions are substituted in the place of iron ions, one type in itself giving rise to $(d4\pi M_s/dT_g)<0$ and the other giving rise to $(d4\pi M_s/dT_g)>0$.

By mixing these two types of non-magnetic ions, any value of $d4\pi M_s/dT_g$ which is necessary to minimize $1/H_o\, dH_o/dT_g$ can be obtained.

A preferred embodiment of the method according to the invention is characterized in that the composition of the epitaxial layer is represented by the formula $$(ZA)_{3-\frac{x}{3-i}}\, Me^i{}_{\frac{x}{3-i}}\, Me_x{}^{IV}\, Me_y{}^{III}\, Fe_{5-x-y}\, O_{12} \text{ with } 0.2 \leq x \leq 0.8;$$

$$0 < y \leq 0.8 \text{ and } 0.4 \leq \frac{x}{x+y} \leq 1.0,$$

wherein $Me^{IV}$ and $Me^{III}$ are quadrivalent and trivalent non-magnetic ions, respectively; $Me^i$ is a charge-compensating ion; i is the valency of the $Me^i$ ion; and ZA is selected from the group of elements having atomic numbers 39 and 57 to 71 inclusive.

During investigations which led to the invention it was found that the substitution of non-magnetic ions with a charge $+3$ results in a negative value of $d4\pi M_s/dT_g$ and that the substitution of non-magnetic ions having a charge $+4$ results in a positive value of $d4\pi M_s/dT_g$.

Trivalent ions suitable within the scope of the invention are notably $Ga^{3+}$ and $Al^{3+}$, and suitable quadrivalent ions are notably $Ge^{4+}$ and $Si^{4+}$. In the latter case the charge-compensating ion is, for example, $Ca^{2+}$ or $Sr^{2+}$.

The invention also relates to a device for manipulating magnetic bubble domains, comprising a layer of magnetic bubble domain material of rare earth-iron garnet deposited epitaxially on a monocrystalline substrate while using the method of the invention.

BRIEF DESCRIPTION OF THE DRAWINGS

The invention will now be described in greater detail, by way of example, with reference to the drawing. In the drawing.

DESCRIPTION OF THE PREFERRED EMBODIMENTS

Figure 1:
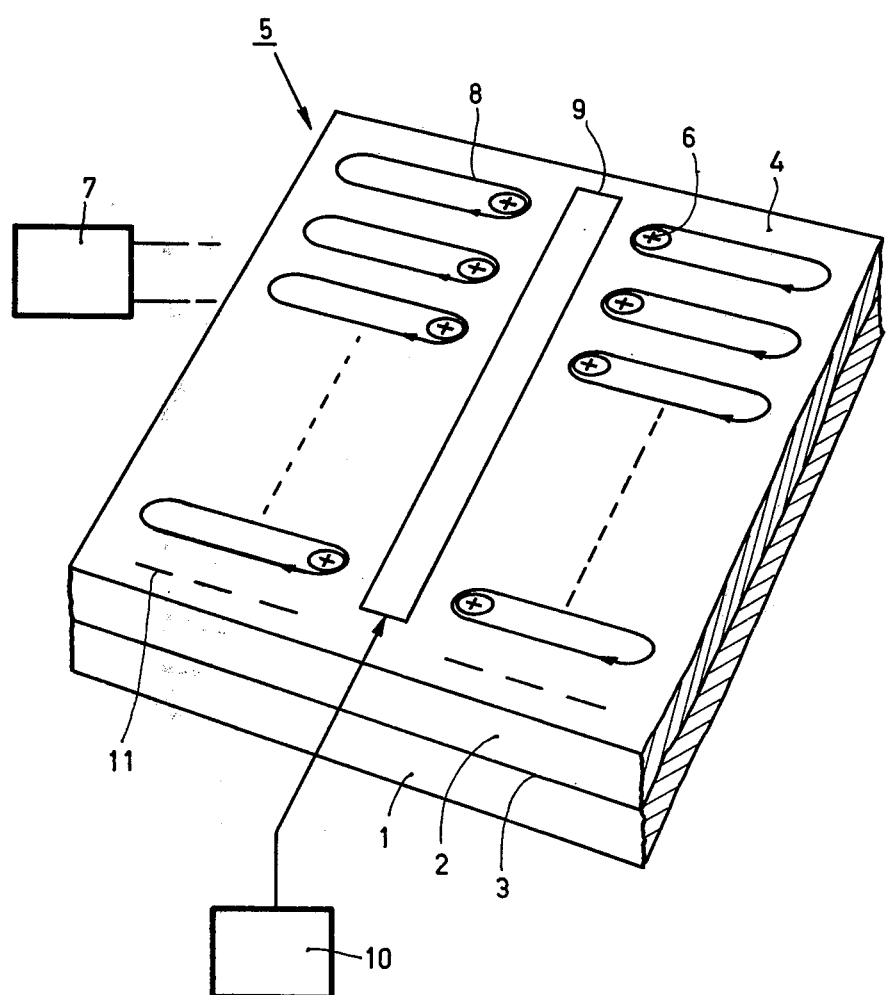
FIG. 1 is a schematic perspective view of a device whose operation depends on the generation and propagation of magnetic bubble domains in thin rare earth-iron garnet layers.
Figure 2:
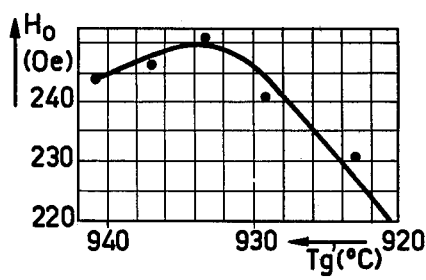
FIGS. 2 to 8 are graphic representations demonstrating the dependence of the collapse field $H_o$ on the growth temperature $T_g$ of a number of bubble domain materials grown within the scope of the invention.
Figure 3:
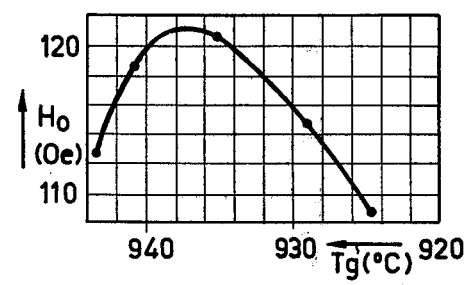
Figure 4:
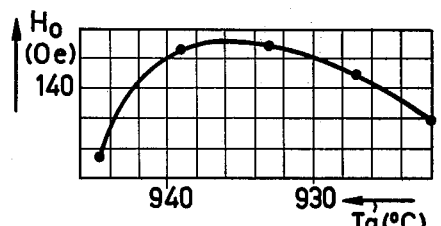
Figure 5:
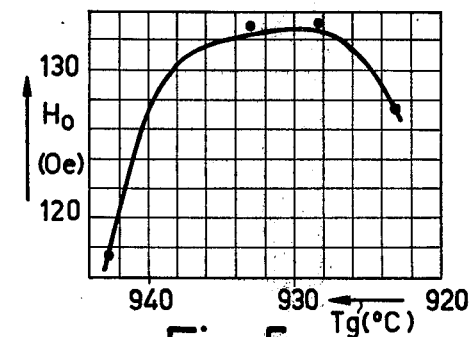
Figure 6:
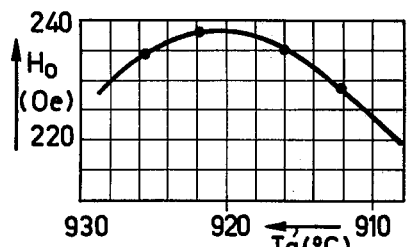
Figure 7:
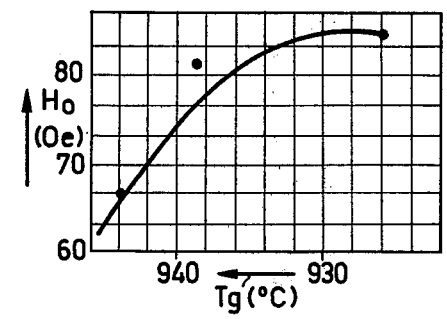
Figure 8:
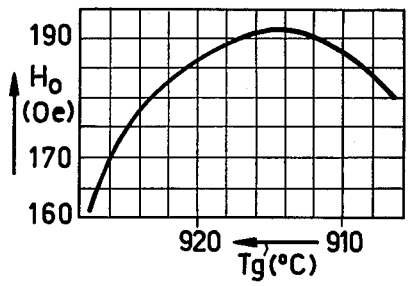

FIG. 1 shows a substrate layer 1 and a layer 2 for the active storage and propagation of magnetic domains which have a common interface 3, each layer being characterized by a particular nature and by a mutual relationship to be described hereinafter. The layer 2 has an uppermost surface 4 opposite to the interface 3. The layer 2 for storing or propagating magnetic domains may, generally speaking, be the place of each of the various operations for digital logic, as they are explicitly described in patents and other technical literature. Reference may be made, for example, to an article entitled "Properties and Device Applications of Magnetic Domains in Orthoferrites," Bell System Technical Journal, Vol. XLVI, No. 8, pp. 1901–1925 (1967).

FIG. 1 is a representation of a general nature which shows a simple configuration which represents only a part of a normally larger construction including the layer 2 for storage and propagation of magnetic domains and several usual elements for generating, propagating and scanning magnetic domains. FIG. 1 may be deemed to represent a bubble domain device 5 having a major-minor loop organization, in which the layer 2 of magnetic material according to the invention is used, in which the easy axis of magnetization of the layer 2 is perpendicular to the surface 4. The general magnetization state of layer 2 is denoted by minus signs, for example minus sign 11, which denote the lines of magnetic flux directed in the surface 4. Flux lines situated within the domains and directed oppositely are represented by plus signs, for example plus sign 6.

The bias field is provided in the usual manner, for example, by using a conventional coil or coils (not shown) which surround the two-layer configuration, or by using permanent magnets arranged in the usual manner.

The propagation of bubble domains, for example, the domain shown by the + sign 6, is prescribed by patterns of soft magnetic material under the influence of a rotating in-plane field which is produced by a source represented by the block 7. The rotating field, for example, rotates clockwise and the soft magnetic patterns not shown in detail may be formed, for example, by T and I-shaped segments. Shown are horizontal information loops ("minor loops"), for example loop 8, and a vertical loop 9 to explain the organization of the device 5. Block 10 denotes a write-read circuit coupled to the vertical loop 9 ("major loop").

The invention is used in the growth of the layer 2 (thickness $\leq 10\mu$um). In general the composition of the layer is derived from a magnetic oxide having garnet structure, $(RE)_3(Fe)_5O_{12}$, or more specifically $Y_3Fe_5O_{12}$. This yttrium-iron garnet, known as YIG, has three lattice sites, because of which it is denoted as $\{Y_3{}^{3+}\}\,[Fe_2{}^{2+}]\,(Fe_3{}^{3+})O_{12}$, where { } denotes the dodecahedral sites:
[ ] denotes the octahedral sites;
( ) denotes the tetrahedral sites.

The saturation magnetization $4\pi M_s$ is adjusted to a desired value by replacing some of the iron ions by non-magnetic ions, it being essential that the replacing non-magnetic ions occupy primarily tetrahedral sites in the lattice. These non-magnetic ions may in principle be the following:

$Al^{3+}$, $Ga^{3+}$ which, however, substitute also partly in octahedral sites; or $Si^{4+}$, $Ge^{4+}$ which, due to charge compensation, must be combined with, for example, the same number of $Ca^{2+}$ ions and/or $Sr^{2+}$ ions, which latter ions substitute in dodecahedral sites. These ions have a much larger preference for the tetrahedral sites than $Al^{3+}$ or $Ga^{3+}$, which results in a higher Curie temperature.

In order to be able to support stable bubbles it is necessary for the magnetic polarization of the layer to have one specific easy axis, namely perpendicular to the plane of the layer. For that purpose, the material is usually modified so that a growth-induced uniaxial anisotropy arises. This is done by substituting certain rare earth metal ions, in particular Sm or Eu, in the dodecahedral sites. This substitution is even more effective if it occurs in combination with a rare earth metal ion which has an ion radius differing considerably from that of Sm or Eu. Ions to be considered for this purpose preferably have a low value of the damping parameter, as for example Tm, Yb and Lu.

Although some of the ions which are used to obtain the growth-induced anisotropy are magnetic, their magnetic contribution at room temperature is small so that said contribution upon adjusting the saturation magnetization can usually be neglected. It is then obvious that the magnetisation and the anisotropy can be adjusted independently of each other according to quite different mechanisms. This provides the possibility of adjusting $d4\pi M_s/dT_g$, without taking into account the effect of the rare earth ions which mainly serve to adjust the anisotropy. The only important factors are by which and by how many non-magnetic ions the iron is replaced.

The invention is of specific importance in the LPE (liquid phase epitaxy) process to grow magnetic garnet layers for bubble domain applications. These thin layers are grown on a non-magnetic substrate for which gadolinium gallium garnet (GGG) is generally used. However, other substrates are also feasible in which the thin layers will then have a slightly different composition due to the requirement of adaptation in lattice parameter. The principle of the invention—control of $1/H_o(d/dT_g)H_o$ by means of the adjustment of $(d/dT_g)4\pi M_s$ then also applies.

The LPE process uses a solution of the components of the magnetic layer to be grown (preferably in an oxidic form) in a flux. The flux is a molten mixture of compounds, for example lead oxide (PbO), lead fluoride (PbF$_2$), barium oxide (BaO), barium fluoride (BaF$_2$), bismuth oxide (Bi$_2$O$_3$) and boron oxide (B$_2$O$_3$). The combination of lead oxide (PbO) and boron oxide (B$_2$O$_3$) in a weight ratio of approximately 50:1, that is a molar ratio of approximately 15:1, is generally preferred.

The growth takes place by introducing the non-magnetic substrate into the melt at a temperature below the saturation temperature of the melt. The desired material of garnet structure then crystallizes out on the substrate, provided the correct growth conditions are selected. The growth can take place by using the process of "tipping" (see Appl. Phys. Letters, 18 89, (1971) or the process of "dipping" in the super cooled melt at a constant temperature (see Appl. Phys. Letter, 19, 486, (1971)).

This "dipping" process is the process which nowadays is generally used for the manufacture of magnetic garnet layers for bubble domain applications. In this process the substrate is dipped a few minutes in the melt, the plane of the substrate being horizontal. During dipping the substrate is rotated alternately clockwise and counter-clockwise at a speed of approximately 120 r.p.m, (the rotation sense being reversed, for example, after every 5 revolutions). After the dipping the melt is flung off the layer by means of a rapid rotation ($\geq 500$ rpm).

EXAMPLES

Bubble domain materials having a bubble domain diameter between 1 and 6 microns and having compositions represented by the general formula:

$$(Y_{3-x-z}Sm_aZ_zLu_{(1-a)z}Me_x^{II})(Fe_{5-x-y}Me_x^{IV}M_y^{III})O_{12}$$

wherein
$Me^{II} = Ca^{2+}, Sr^{2+}$
$Me^{IV} = Ge^{4+}, Si^{4+}$
$Me^{III} = Ga^{3+}, Al^{3+}$ were grown from the melts recorded in Table I in which the above-described growth process was followed. The quantities in Table I are in mol.%.

Table II gives properties of bubble domain materials grown from the melts specified in Table I, as well as the atomic ratio of the non-magnetic ions in the melt, the measured value of the saturation magnetization $4\pi M_s$ of the grown layer in Gauss, the strip domain width ($\cong$ bubble domain diameter) B in $\mu m$, the number of the figure in which the dependence of the collapse field $H_o$ on the growth temperature $T_g$ is plotted for the melt in question, the optimum growth temperature $T_{og}$ in °C. derived from the figure and the supercooling $\Delta T_s$ (in °C.) occurring at said optimum growth temperature.

Table I

| No. | Cg67 | Cg77$^B$ | Cg77 | Cg76$^B$ | Cg78 | Cg71$^B$ | Cg72 |
|---|---|---|---|---|---|---|---|
| PbO | 80.74 | 80.94 | 80.99 | 81.04 | 80.85 | 81.13 | 81.13 |
| B$_2$O$_3$ | 5.38 | 5.40 | 5.40 | 5.40 | 5.39 | 5.41 | 5.41 |
| Fe$_2$O$_3$ | 9.75 | 9.72 | 9.79 | 9.83 | 9.86 | 9.94 | 9.94 |
| GeO$_2$ | 1.71 | 1.47 | 1.42 | 1.34 | 1.57 | 1.24 | — |
| SiO$_2$ | — | — | — | — | — | — | 1.24 |
| Al$_2$O$_3$ | — | — | — | — | — | 0.62 | — |
| Ga$_2$O$_3$ | 0.29 | 0.60 | 0.58 | 0.62 | 0.34 | — | 0.62 |
| Y$_2$O$_3$ | 0.035 | 0.35 | 0.36 | 0.34 | 0.50 | 0.30 | 0.28 |
| Sm$_2$O$_3$ | 0.02 | 0.03 | 0.02 | 0.03 | 0.04 | 0.12 | 0.14 |
| Lu$_2$O$_3$ | 0.03 | 0.03 | 0.02 | 0.03 | 0.06 | — | — |
| CaCO$_3$ | 1.72 | 1.46 | 1.42 | 1.34 | 1.58 | 1.24 | 1.24 |

Table II

| No. | Cg67 | Cg77$^B$ | Cg77 | Cg76$^B$ | Cg78 | Cg71$^B$ | Cg72 |
|---|---|---|---|---|---|---|---|
| x/(x + y) | 0.75 | 0.55 | 0.55 | 0.52 | 0.70 | 0.50 | 0.50 |
| x/y | 3.00 | 1.22 | 1.22 | 1.08 | 0.33 | 1.00 | 1.00 |
| 4$\pi$M | 385 | 240 | 273 | 270 | 390 | 218 | 360 |
| B | 2.1 | 3.7 | 2.7 | 3.0 | 2.5 | 6 | 3.2 |
| FIG. | 2 | 3 | 4 | 5 | 6 | 7 | 8 |
| T$_{og}$ | 933 | 937 | 936 | 931 | 920 | 928 | 915 |
| $\Delta T_s$ | 13 | 21 | 16 | 22 | 18 | 30 | 24 |

As will be apparent from FIGS. 2 to 8, the value of $H_o$ can be much more reproducably achieved by means of the invention, than has been possible in the past. For example, a 4% variation in the collapse field $H_o$ have been considered normal in literature in the growth of a 4$\mu$m bubble domain material of the composition:

$$Y_{3-x-y-z}Sm_yLu_zFe_{5-x}Ge_xO_{12}$$

However, it appears from FIGS. 2 to 8 that, for example, a variation in the growth temperature of 5° C. need not cause a variation of more than 1% in the value of $H_o$. What is claimed is:

1. A method of depositing an epitaxial layer of a magnetic bubble domain material of rare earth-iron garnet on a monocrystalline substrate, in which method a quantity of starting material is heated so as to form a uniform melt, then cooled to a supersaturated condition at a temperature substantially equal to a temperature $T_g$, and after which the substrate is contacted with the melt until an epitaxial layer of the desired thickness has been deposited on the substrate, wherein a starting material is chosen which provides an epitaxial layer represented by an atomic formula in which the iron ions are partly substituted by two types of non-magnetic ions, one type, if substituted alone, would give rise to a material with $(d/dT_g) 4\pi M_s < 0,$ the other type, if substituted alone, would give rise to a material with $(d/dT_g) 4\pi M_s > 0,$ the atomic ratio between the quantities of the two types of non-magnetic ions being chosen such that at $T_g$ $1/H_o (d/dT_g) H_o$ is zero or substantially zero, wherein $4\pi M_s$ is the saturation magnetization of the material, and $H_o$ is the bubble domain collapse field.

2. A method as claimed in claim 1, wherein the composition of the epitaxial layer is represented by the formula:

$(ZA)_{3-\frac{x}{3-i}} Me^i_{\frac{x}{3-i}} Me^{IV}_x Me^{III}_y Fe_{5-x-y} O_{12}$ with $0.2 \leq x \leq 0.8$; $0 < y \leq 0.8$ and $0.4 \leq \frac{x}{x+y} < 1.0,$ wherein
$Me^{IV}$ and $Me^{III}$ are non-magnetic ions having a charge +4 and +3, respectively,
$Me^i$ is a charge-compensating ion;
ZA is selected from the group of elements having atomic number 39 and 57 to 71 inclusive, and
i is the valency of the $Me^i$ ion.

3. A method as claimed in claim 2, wherein
$Me^{III}$ is $Ga^{3+}$ and/or $Al^{3+}$
$Me^{IV}$ is $Ge^{4+}$ and/or $Si^{4+}$
$Me^i$ is $Ca^{2+}$ and/or $Sr^{2+}$.

4. A magnetic bubble domain layer on a substrate comprising a layer of magnetic bubble domain material of rare earth-iron garnet deposited epitaxially on a monocrystalline substrate while using the method of claim 1, 2 or 3.

* * * * *